(12) United States Patent
Weiss (10) Patent No.: US 6,479,825 B1
(45) Date of Patent: Nov. 12, 2002

(54) LOW-ENERGY PARTICLE SENSOR

(75) Inventor: Paul Weiss, Neuchatel (CH)

(73) Assignee: CSEM Centre Suisse d'Electronique et de Microtechnique SA, Neuchatel (CH)

( * ) Notice: Subject to any disclaimer, the term of this patent is extended or adjusted under 35 U.S.C. 154(b) by 49 days.

(21) Appl. No.: 09/616,514

(22) Filed: Jul. 14, 2000

(30) Foreign Application Priority Data

Jul. 16, 1999 (FR) .............................................. 99 09261

(51) Int. Cl.[7] .............................................. H01L 31/06
(52) U.S. Cl. .............................. 250/370.02; 250/370.01; 250/370.03; 250/370.14; 257/429
(58) Field of Search ....................... 250/370.01, 370.02, 250/370.03, 370.05, 370.08, 370.14; 257/429

(56) References Cited

U.S. PATENT DOCUMENTS 5,355,013 A * 10/1994 Parker ......................... 257/458

OTHER PUBLICATIONS

Kemmer et al., "New Structures for Position Sensitive Semiconductor Detectors," Nuclear Instruments and Methods in Physics Research A273, pp. 588–598 (1988).*
Wafer–Scale Technology for Double–Sided Silicon Microstrip Particle Detectors by P. Weiss et al. *The 7th International Conference on Solid–State Sensors and Actuators*, (Transducers '93) Yokohama Japan pp. 668–671 Jun. 7–10, 1993.

"Semiconductor Radiation Detector," Patent Abstracts of Japan, vol. 005, No. 121, Publication No. 56 060067 (May 23, 1981) to Toshiba Corp.

"Semiconductor Radiation Detector," Patent Abstracts of Japan, vol. 006, No. 034, Publication No. 56 151377 (Nov. 24, 1981) to Toshiba Corp.

"New Mesh Type Silicon Photodiode and Its Performance," Nuclear Instruments & Methods in Physics Research, Section —A: Accelerators, Spectrometers, Detectors and Associated Equipment, NL–Publishing Co., Amsterdam, vol. A327, No. 1 (Mar. 20,, 1993), pp. 148–151.

"A New Microstrip Detector with Double–Sided Readout," IEEE Transactions on Nuclear Science, US, IEEE, Inc., New York, vol. 37, No. #–I, (Jun. 1, 1990), pp. 1153–1161.

* cited by examiner

*Primary Examiner*—Constantine Hannaher
*Assistant Examiner*—Timothy Moran (57) ABSTRACT

A low-energy particle sensor includes current collection areas which take the form of diodes partially covering the substrate. In detection areas defined alongside the collection areas the small thickness of the material enables low-energy particles (in particular a particles or protons) to penetrate the substrate. The currents generated by particles forming electron-hole pairs in this substrate are collected by the diode regions and sent to a load circuit. Applications include sensors for detectors of products resulting from collisions brought about in particle physics research apparatus.

8 Claims, 8 Drawing Sheets

LOW-ENERGY PARTICLE SENSOR

BACKGROUND OF THE INVENTION

1. Field of the Invention

The present invention relates to a particle sensor of the type used in particular in the detectors of particle physics research installations such as particle accelerators, collision apparatus and the like. A sensor of this type is intended in particular to locate accurately the point of passage and of interaction of particles generated during experiments conducted in such apparatus.

2. Description of the Prior Art

A sensor of the above type is described in an article by P. Weiss et al., presented at the 7th International Conference on Solid State Actuators and Detectors under the title "Wafer-scale Technology For Double-sided Silicon Microstrip Particle Detectors".

The above prior art detector is essentially designed to analyze high-energy particles but it is ill-suited to detecting particles having a low energy, such as α particles or protons, because it is optimized for particles having a very long range.

The object of the invention is to provide a particle sensor enabling sensing of low-energy particles.

SUMMARY OF THE INVENTION

The invention therefore provides a particle sensor, in particular for a detector for analyzing products of collisions in particle physics apparatus, comprising:

a semiconductor substrate, a plurality of doped regions formed in said substrate and each forming a diode in conjunction with said substrate, means for defining on top of a first face of said substrate a plurality of current collection areas for respectively collecting currents circulating in each of said diode regions as the result of impacts of particles on said sensor, said means for defining said current collection areas being adapted to be connected to means for using signals formed by the collected currents, biasing means for biasing each of said diode regions and for bringing said substrate to a totally depleted state, and means for defining on said first face of said substrate a plurality of particle detection areas each of which is contiguous with a respective current collection area, said means for defining said detection areas having a thickness on top of said substrate which is less than that of said means for defining said current collection areas to enable detection of low-energy particles.

Because of the above features, the sensor has separate areas specifically dedicated to collecting current and detecting particles. The detection areas can therefore have the minimum thickness and do not impede the passage of particles into the substrate.

According to other advantageous features of the invention:

the current collection areas and the detection areas have an elongate shape and are disposed in an alternating arrangement parallel to an edge of the substrate;

the current collection areas surround the detection areas and form respective areas disposed in a matrix on the first face of the substrate;

the means for defining a detection area comprise an oxide layer deposited on the first face of the substrate;

the oxide layer is covered with a thin protective metalization layer;

the face of the substrate opposite the first face comprises a current collecting device;

the thickness of the oxide layer is less than or equal to 50 nm;

the thickness of the protection layer is less than or equal to 40 nm;

the width of a detection area is greater than or equal to that of a current collection area.

Other features and advantages of the invention will become apparent during the course of the following description, which is given by way of example only and with reference to the accompanying drawings.

BRIEF DESCRIPTION OF THE DRAWINGS

FIG. 1 shows an equivalent circuit diagram of a particle sensor according to the invention.

DETAILED DESCRIPTION OF THE PREFERRED EMBODIMENTS

To assist in understanding the invention, FIG. 1 shows an equivalent circuit diagram of a particle sensor of the type to which the invention applies. It comprises a plurality of diodes D1, D2, ..., Dn each of which is connected in series with a resistive device such as a bias resistor R1, R2, ..., Rn across a common supply of voltage U. Each node between a resistor and a diode is connected via a coupling capacitor C1, C2, ..., Cn to an amplifier A1, A2, ..., An connected to a load circuit (not shown). A sensor can include up to one thousand diodes formed in the same semiconductor substrate.

The operation of the sensor is based on the production of electron-hole pairs in a semiconductor substrate maintained in a totally depleted state as a result of the impact of particles on the substrate. The formation of the electron-hole pairs generates a current in the diode which is near the point of impact of the particle. That current can be collected at the surface of the substrate, amplified and used as a signal representative of a local particle impact.

Figure 2:
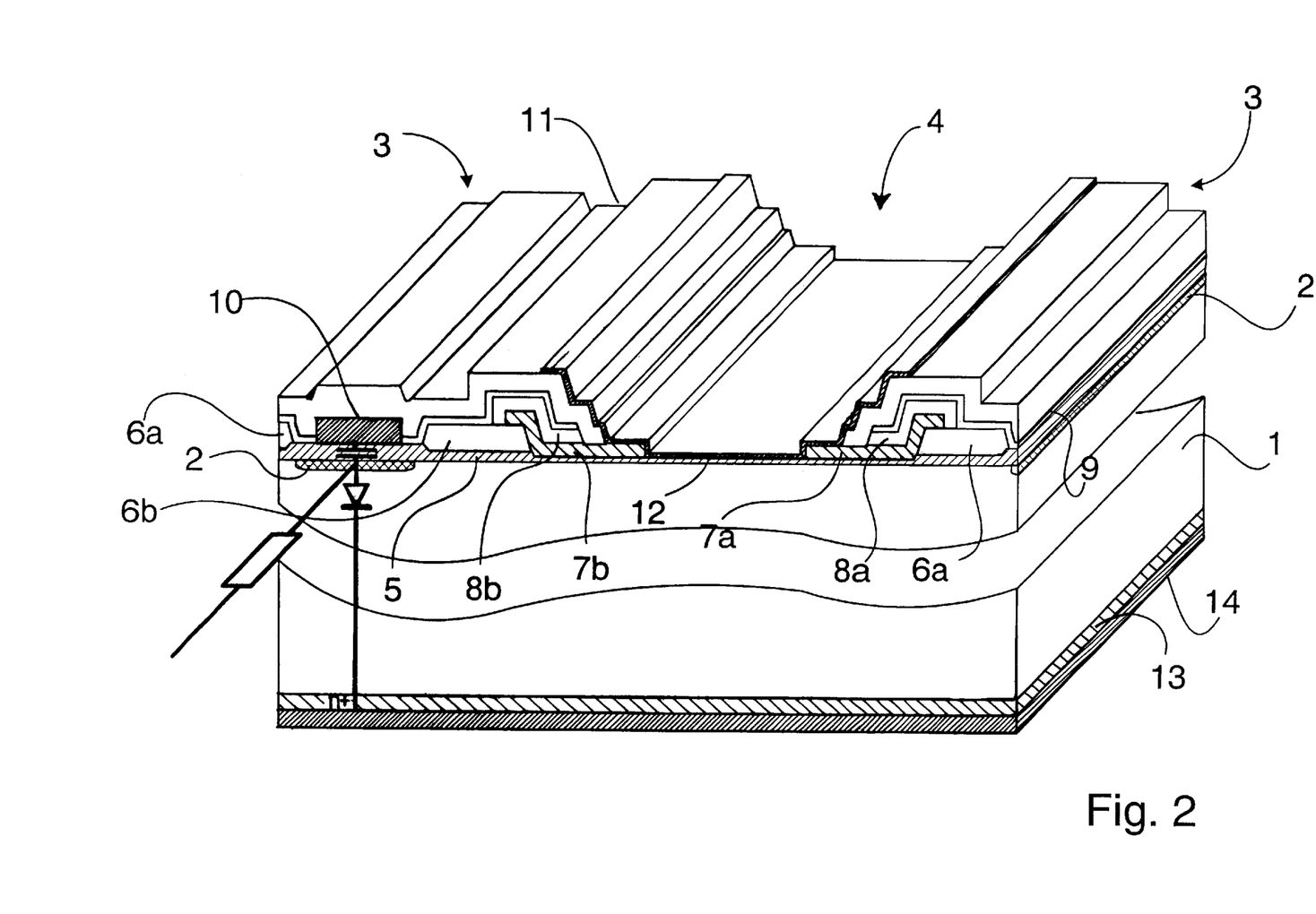
FIG. 2 is a perspective view of part of the sensor.
Figure 3:
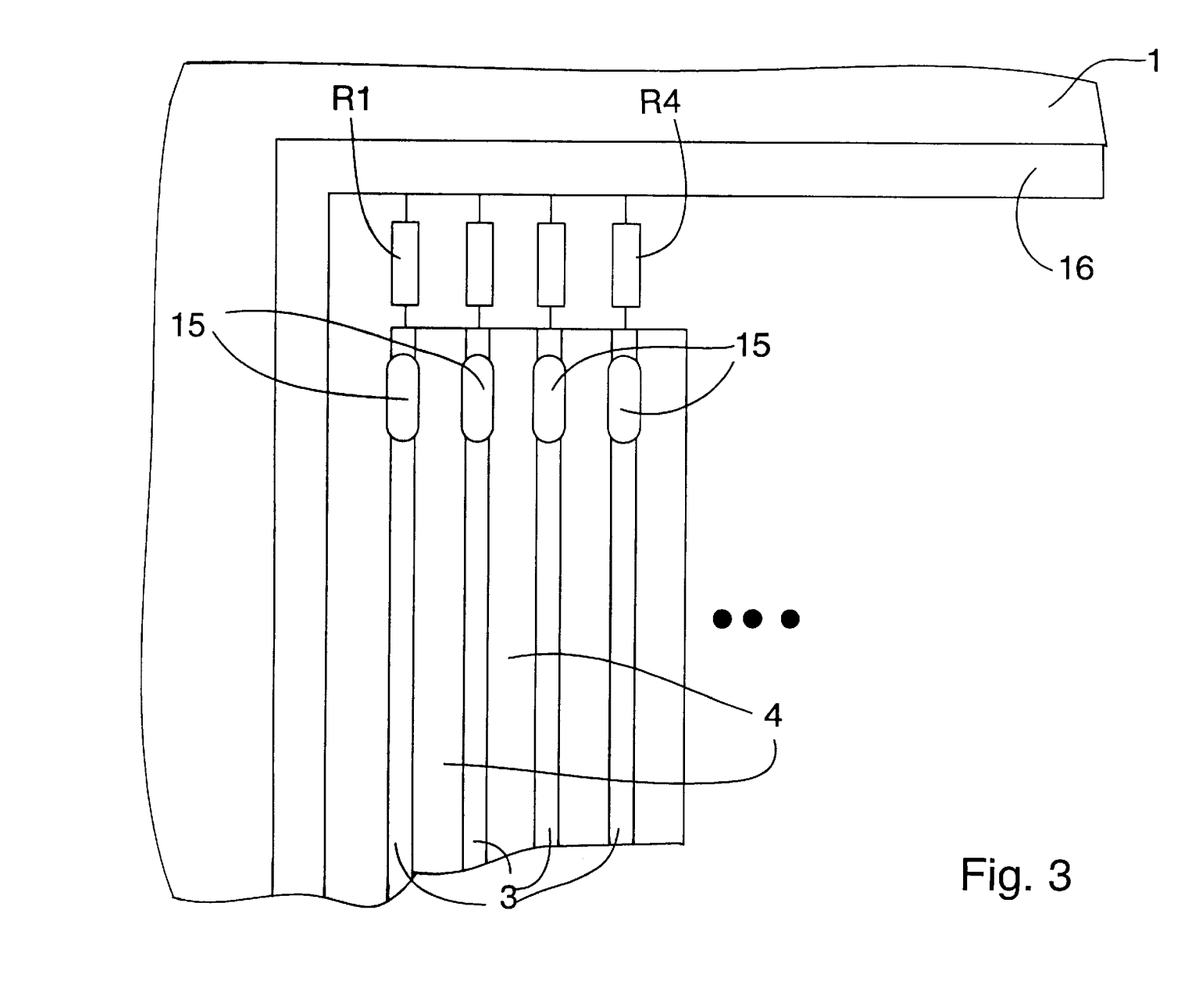
FIG. 3 is a diagrammatic plan view of part of the sensor.

FIGS. 2 and 3 show a preferred embodiment of a sensor according to the invention.

It has an n-type silicon semiconductor substrate 1.

A plurality of p+doped regions 2 is formed in the substrate 1 and each forms a diode junction with the substrate. The top face of the substrate 1 is covered with a plurality of superposed layers of different materials whose various configurations are obtained by deposition, photolithography and etching techniques known to the skilled person. They are designated by reference numbers with no letter suffix in FIG. 5 and the portions that remain after fabrication of the sensor are designated in FIGS. 2 and 3 by the corresponding reference numbers with letter suffixes where necessary.

The various superposed layers define in conjunction with each diode D1 (or each p+region) a current collection area 3 and a particle detection area 4, the area 3 being partially superposed on the part of the substrate 1 in which the p⁺region 2 is formed. The area 4 is adjacent the area 3. FIG. 2 is a partial view in perspective showing an area 3, an area 4 and part only of another adjacent area 3.

An oxide layer 5 covers the whole of the top surface of the substrate 1. It is relatively thick in two portions 6a and 6b located in each collection area 3.

The oxide layer 5 is partly covered with a layer 7 of polysilicon, two portions 7a and 7b of which remain at two levels on the flanks of the collection area 3.

A layer 8 of dielectric or coupling material has two separate portions 8a and 8b located partly on top of the respective portions 6a and 6b.

A layer 9 preferably made of nitride constitutes a protection layer.

Figure 5:
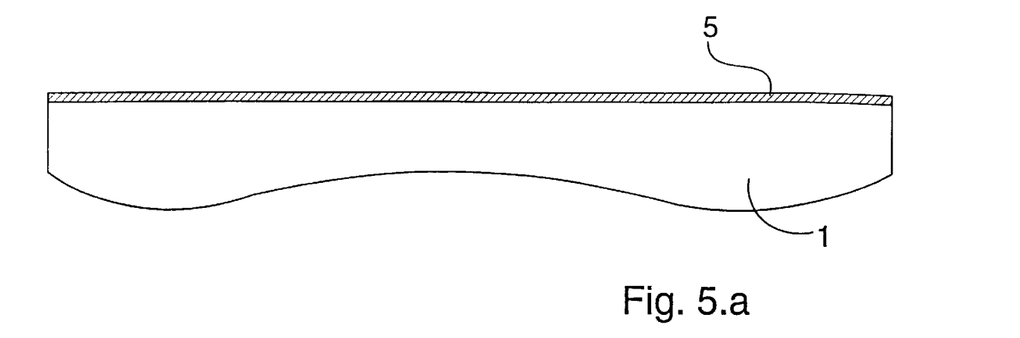
FIG. 5 shows, by means of a series of diagrammatic sectional views a) through k), a method of fabricating a particle sensor constituting an embodiment of the invention differing slightly from that shown in FIG. 2.

In a region on top of the diode region 2 the oxide layer 5 is covered with a metallic area 10 (FIG. 5.g). This forms the coupling capacitor C1 to Cn in conjunction with the diode region 2.

A connection layer 11 covers everything described so far, with the exception of an external part of the portions 7a and 7b of the polysilicon layer 7. That layer provides the connection to the corresponding amplifier A1 to An.

The detection area 4 is delimited between the portions 7a and 7b, in which the corresponding part of the oxide layer 5 remains and has a carefully selected thickness. This part is covered with a metalization layer 12 which also covers a portion of the flanks of the two adjacent collection areas 3.

It can be seen that the means which define the detection area 4 have a thickness consisting only of the sum of the thicknesses of the layers 5 and 12, which is significantly less than the total thickness of the current collection areas 3. This value is sufficiently small for any low-energy particle, such as an a particle or a proton, to penetrate the substrate 1 easily and create therein the expected electron-hole pairs, which can be detected by the adjacent collection area.

In the embodiment shown in FIGS. 2 and 3 the bottom face of the substrate is covered with an n⁺layer 13 followed by a metallic layer 14 providing a common connection intended to be connected to the positive terminal of the source of voltage U (FIG. 1).

Also, as shown more particularly in FIG. 3, the collection areas 3 and the detection areas 4 define juxtaposed alternating strips extending parallel to one edge of the substrate 1.

The resistors R1 to Rn are also integrated into the substrate, at respective ends of the elongate collection areas 3. These have connection areas 15 adapted to be connected to the respective amplifiers A1 to An.

A connecting track 16 connects all the resistors R1 to Rn to the negative terminal of the source of voltage U.

The embodiment just described with reference to FIGS. 2 and 3 can locate low-energy particles in only one direction, namely that perpendicular to the elongate areas 3 and 4. Unidirectional location may be sufficient for some experiments carried out in the detectors referred to above.

In a different embodiment of the sensor described a current collection device formed by an array of parallel conductive tracks oriented transversely to the areas 3 and 4 can be formed on the face of the substrate 1 opposite the collection and detection areas 3 and 4, as disclosed in the aforementioned article. Matrix location of incident particles is then possible.

Figure 4:
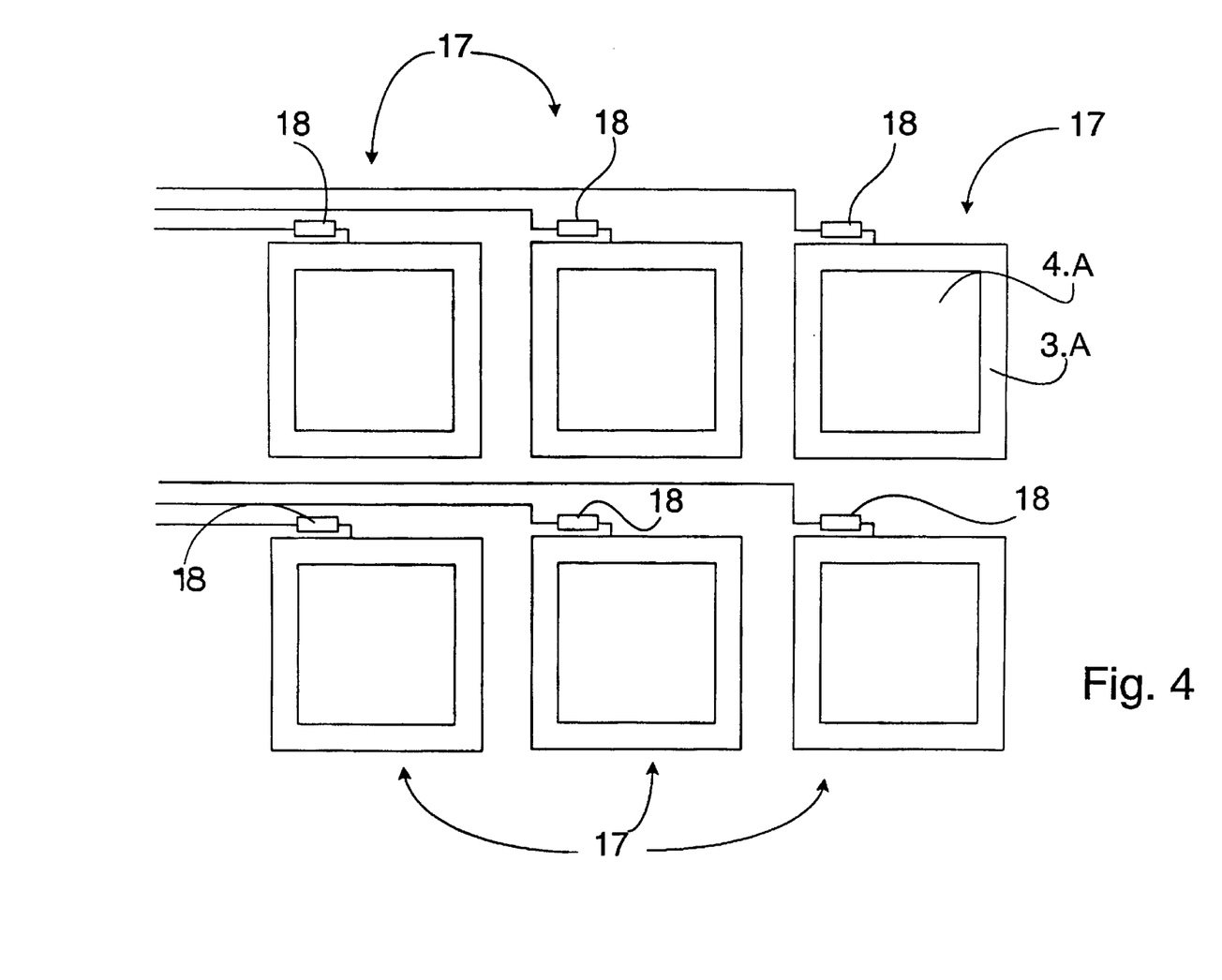
FIG. 4 shows a different embodiment of the sensor according to the invention.

In the embodiment shown in FIG. 4 the sensor comprises a substrate (not shown) in which are formed capture regions 17 each of which takes the form of a detection area 4A surrounded by a collection area 3A. The latter can have the same basic structure as the areas 3 and 4 shown in FIGS. 2 and 3, and because they are arranged as a matrix it is possible to locate particles in two directions. The collection areas 3A are connected to the voltage source (not shown) by resistors 18.

The embodiments of the sensor just described enable detection of low-energy particles thanks to the small thickness and the small number of layers in the particle detection areas 4 and 4A. Obviously particles impacting on the sensor in the collection areas 3 or 3A will be stopped by the superposed layers of material therein. The possibility of detecting low-energy particles is therefore to the detriment of detecting all of the low-energy radiation impacting on the sensor. However, resolution is not affected and the solution proposed proves to be the optimum one for many applications.

FIG. 5 is a diagrammatic representation of the steps of a preferred method of fabricating another embodiment of a sensor according to the invention. Note that the cross sections in this figure correspond to a slightly different marginal part of the sensor shown in FIGS. 2 and 3 in an end region including a resistor R1 to Rn and a connection area 15 for connecting the corresponding collection area 4 to an amplifier A1 to An.

FIG. 5.a shows that an oxide layer 5 is first deposited on the substrate 1.

FIG. 5.b shows several steps of the process. First, openings are formed in the oxide layer 5 to define the diode region 2 and the width of the detection area 4. The dimensions of the diode region 2 are chosen according to the required capacitance of the respective capacitor C1 to Cn.

If the sensor is fabricated with the strip configuration shown in FIG. 3, the cumulative width of a detection area and a collection area is preferably of the order of 50 μm and the width of a detection area is equal to or greater than that of a collection area and preferably equal to 1.5 times the width of the latter.

An photoresist layer 19 is then deposited to enable doping of the diode region 2, preferably with boron.

The polysilicon layer 7 is then deposited (FIG. 5.c). It is doped and configured appropriately to form the resistor (here designated R) and the portions 7a and 7b shown in FIG. 2 (FIG. 5.d).

The coupling oxide layer 8 is then deposited or grown, followed by depositing the protection layer 9 (FIG. 5.e).

The layers 8 and 9 are then selectively eliminated (FIG. 5.f) to open up contacts for the resistor R, to enable the deposition of the metallic portion 10 for the coupling capacitor and to uncover the layer 7 in the detection area 4. For the sake of clarity, layer 9 is not represented in the following figures.

Metal is selectively deposited to form in particular the contacts 24 and 25 of the resistor R and the metallic area 10 (FIG. 5.g).

FIG. 5.h shows the formation of connecting terminals 26 and 27. FIG. 5.i shows the etching of the layer 7 and then of the oxide layer 5 in the detection area 4. This last operation adjusts the thickness of the oxide layer 5 in this area to a precise value, for example 50 nm.

Finally, the sensor is completed by depositing a metallic protection layer 14 which can be 40 nm thick, for example (FIG. 5.j). FIG. 5.k is a sectional view of the detection area 4 of the sensor.

What is claimed is:

1. A particle sensor, in particular for a detector for analyzing products of collisions in particle physics apparatus, comprising:
   a semiconductor substrate,
   a plurality of doped regions formed in said substrate and each forming a diode in conjunction with said substrate,
   means for defining on top of a first face of said substrate a plurality of current collection areas for respectively collecting currents circulating in each of said diode regions as the result of impacts of particles on said sensor, said means for defining said current collection areas being adapted to be connected to means for using signals formed by the collected currents,
   biasing means for biasing each of said diode regions and for bringing said substrate to a totally depleted state, and
   means for defining on said first face of said substrate a plurality of particle detection areas, each of which comprises an oxide layer deposited on said first face of said substrate, contiguous with a respective current collection area, said means for defining said detection areas having a thickness on top of said substrate which is less than that of said means for defining said current collection areas,
   wherein said current collection areas and said detection areas have elongate shapes and are disposed in an alternating arrangement parallel to an edge of said substrate, and wherein the thickness of said oxide layer is less than or equal to 50 nm.

2. The particle sensor claimed in claim 1 wherein said current collection areas surround said detection areas and form respective areas disposed in a matrix on said first face of said substrate.

3. The particle sensor claimed in claim 1 wherein the face of said substrate opposite said first face comprises a current collecting device.

4. The particle sensor claimed in claim 1 wherein the width of a detection area is greater than or equal to that of a current collection area.

5. A particle sensor, in particular for a detector for analyzing products of collisions in particle physics apparatus, comprising:
   a semiconductor substrate,
   a plurality of doped regions formed in said substrate and each forming a diode in conjunction with said substrate,
   means for defining on top of a first face of said substrate a plurality of current collection areas for respectively collecting currents circulating in each of said diode regions as the result of impacts of particles on said sensor, said means for defining said current collection areas being adapted to be connected to means for using signals formed by the collected currents,
   biasing means for biasing each of said diode regions and for bringing said substrate to a totally depleted state, and
   means for defining on said first face of said substrate a plurality of particle detection areas, each of which comprises an oxide layer deposited on said first face of said substrate, contiguous with a respective current collection area, said means for defining said detection areas having a thickness on top of said substrate which is less than that of said means for defining said current collection areas,
   wherein said current collection areas and said detection areas have an elongate shape and are disposed in an alternating arrangement parallel to an edge of said substrate, and wherein said oxide layer is covered with a protective metallization layer having a thickness of less than or equal to 40 nm.

6. The particle sensor claimed in claim 5 wherein said current collection areas surround said detection areas and form respective areas disposed in a matrix on said first face of said substrate.

7. The particle sensor claimed in claim 5 wherein the face of said substrate opposite said first face comprises a current collection device.

8. The particle sensor claimed in claim 5 wherein the width of a detection area is greater than or equal to that of a current collection area.

* * * * *